US009754724B2

(12) United States Patent
Van Kampen et al.

(10) Patent No.: US 9,754,724 B2
(45) Date of Patent: Sep. 5, 2017

(54) STRESS CONTROL DURING PROCESSING OF A MEMS DIGITAL VARIABLE CAPACITOR (DVC)

(71) Applicant: CAVENDISH KINETICS, INC., San Jose, CA (US)

(72) Inventors: Robertus Petrus Van Kampen, S-Hertogenbosch (NL); Richard L. Knipe, McKinney, TX (US)

(73) Assignee: CAVENDISH KINETICS, INC., San Jose, CA (US)

( * ) Notice: Subject to any disclaimer, the term of this patent is extended or adjusted under 35 U.S.C. 154(b) by 17 days.

(21) Appl. No.: 14/898,678

(22) PCT Filed: Jun. 4, 2014

(86) PCT No.: PCT/US2014/040824
§ 371 (c)(1),
(2) Date: Dec. 15, 2015

(87) PCT Pub. No.: WO2014/209556
PCT Pub. Date: Dec. 31, 2014

(65) Prior Publication Data
US 2016/0126017 A1  May 5, 2016

Related U.S. Application Data

(60) Provisional application No. 61/840,975, filed on Jun. 28, 2013.

(51) Int. Cl.
*H01L 49/02* (2006.01)
*H01G 5/16* (2006.01)
*H01G 5/18* (2006.01)

(52) U.S. Cl.
CPC ............... *H01G 5/16* (2013.01); *H01G 5/18* (2013.01); *H01L 28/60* (2013.01)

(58) Field of Classification Search
None
See application file for complete search history.

(56) References Cited

U.S. PATENT DOCUMENTS 6,012,336 A * 1/2000 Eaton ................. B81C 1/00246
73/754
7,528,691 B2 * 5/2009 Wallis ................ H01H 59/0009
200/181
(Continued)

FOREIGN PATENT DOCUMENTS

CN    102256893 A    11/2011
CN    102725808 A    10/2012
(Continued)

OTHER PUBLICATIONS

First Office Action and Search Report in related application CN 201480036181.1 dated May 31, 2017.

*Primary Examiner* — Ali Naraghi
(74) *Attorney, Agent, or Firm* — Patterson & Sheridan, LLP

(57) ABSTRACT

The present invention generally relates to a MEMS digital variable capacitor (DVC) (900) and a method for manufacture thereof. The movable plate (938) within a MEMS DVC should have the same stress level to ensure proper operation of the MEMS DVC. To obtain the same stress level, the movable plate is decoupled from CMOS ground during fabrication. The movable plate is only electrically coupled to CMOS ground after the plate has been completely formed. The coupling occurs by using the same layer (948) that forms the pull-up electrode as the layer that electrically couples the movable plate to CMOS ground. As the same layer couples the movable plate to CMOS ground and also provides the pull-up electrode for the MEMS DVC, the deposition occurs in the same processing step. By electrically coupling the movable plate to CMOS ground after (Continued)

formation, the stress in each of the layers of the movable plate can be substantially identical.

20 Claims, 12 Drawing Sheets

(56) References Cited

U.S. PATENT DOCUMENTS

| | | | | |
|---|---|---|---|---|
| 7,663,196 | B2* | 2/2010 | Liu | B81C 1/00253 |
| | | | | 257/414 |
| 7,876,120 | B2* | 1/2011 | Awaji | G01R 31/31924 |
| | | | | 324/750.3 |
| 7,978,045 | B2* | 7/2011 | Lee | H01P 1/127 |
| | | | | 337/14 |
| 8,592,876 | B2* | 11/2013 | Ding | G06F 17/5063 |
| | | | | 257/254 |
| 8,945,970 | B2* | 2/2015 | Carley | B81C 1/00198 |
| | | | | 438/52 |
| 9,413,337 | B2* | 8/2016 | Morris, III | H03J 5/0209 |
| 2004/0262645 | A1* | 12/2004 | Huff | B81B 7/0064 |
| | | | | 257/232 |
| 2012/0274141 | A1 | 11/2012 | Shibahara | |
| 2013/0277770 | A1* | 10/2013 | Tsai | G01P 15/0802 |
| | | | | 257/415 |

FOREIGN PATENT DOCUMENTS

| | | |
|---|---|---|
| WO | 2011086767 A1 | 7/2011 |
| WO | 2013028546 A1 | 2/2013 |
| WO | 2013/033613 A2 | 3/2013 |

\* cited by examiner

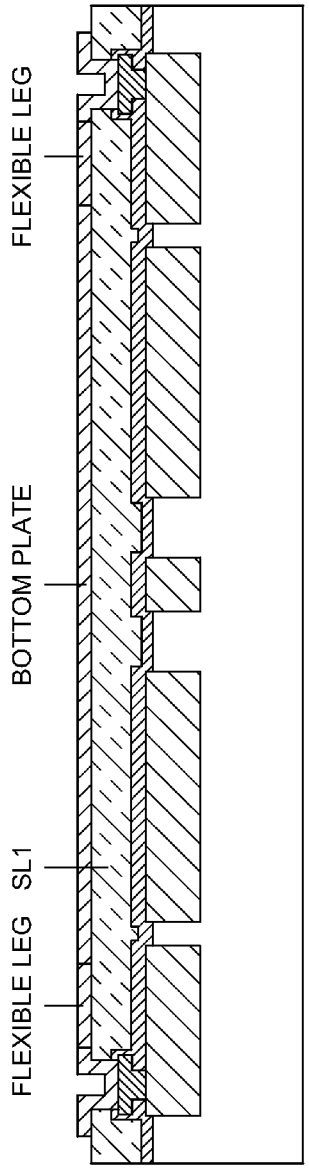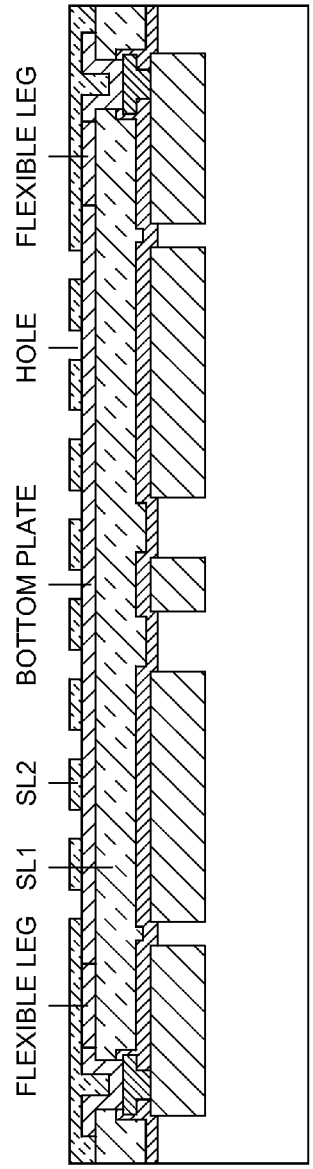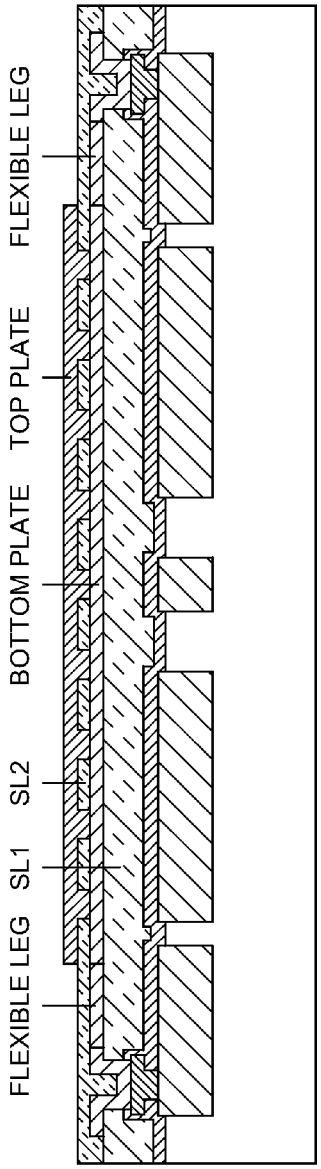
Fig. 7A
Fig. 7B
Fig. 7C

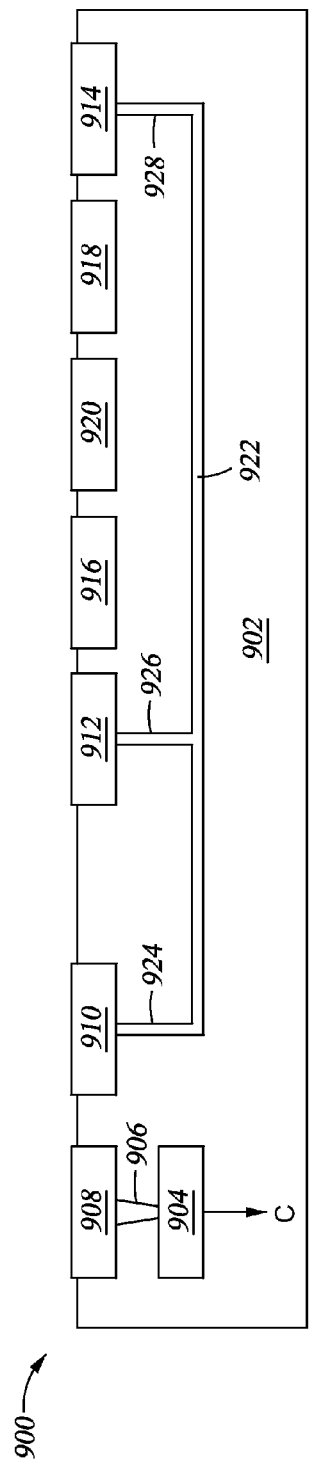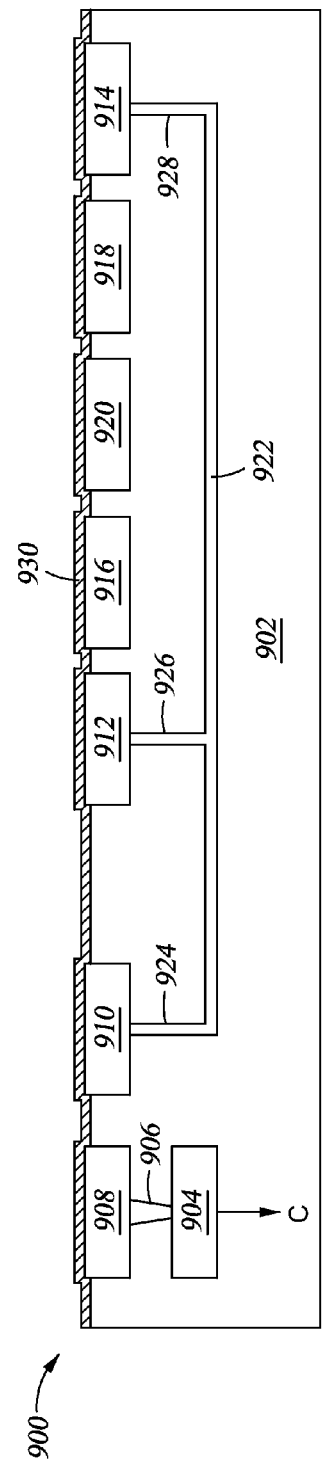
Fig. 9A
Fig. 9B

STRESS CONTROL DURING PROCESSING OF A MEMS DIGITAL VARIABLE CAPACITOR (DVC)

BACKGROUND OF THE INVENTION

Field of the Invention

Embodiments of the present invention generally relate to a micro-electromechanical system (MEMS) and a method for manufacture thereof.

Description of the Related Art

MEMS digital variable capacitor (DVC) devices are based on a moveable MEMS plate with a control-electrode above (i.e., pull-up electrode, pull-off electrode or PU-electrode) and below (i.e., a pull-in electrode, pull-down electrode or PD-electrode) the moveable MEMS plate, as shown schematically in FIG. 1. These electrodes are covered with a top and bottom dielectric layer. In addition there is an RF-electrode below the moveable MEMS element. Between the moveable plate and the RF-electrode there is a gap that is modulated by the voltages applied to either the PU or the PD-electrode with respect to the plate-electrode. These voltages result in electrostatic forces, which pull the MEMS element either up or down in contact to provide a stable minimum or maximum capacitance to the RF-electrode. In this way the capacitance from the moveable plate to the RF-electrode can be varied from a high capacitance state $C_{max}$ when pulled to the bottom (See FIG. 2) to a low capacitance state $C_{min}$ when pulled to the top (See FIG. 3).

FIG. 4 shows a more detailed cross-section view of a MEMS DVC device. The moveable plate consists of 2 layers (i.e., the bottom-plate and the top-plate) which are connected to each other via a plurality of posts. This combination of plates and posts creates a semi-rigid plate which is hard to bend. The plate is anchored to the substrate via a flexible leg-structure which allows relatively low operating voltages to operate the DVC device in the $C_{min}$ or the $C_{max}$ state.

FIG. 5 shows the CMOS waveform controller which generates the required voltages Vpu and Vpd to be applied to the MEMS DVC device on the PU and PD-electrode. The plate potential needs to be referenced to the CMOS ground potential so that the applied voltages on the PU and PD electrodes generate the required electrostatic forces to move the plate up or down to the $C_{min}$ or the $C_{max}$ position. In applications where the plate electrode needs to be RF-floating this reference is made using a high-value resistor Rplate between the plate-electrode and CMOS ground (See FIG. 5).

FIG. 6 shows the CMOS waveform controller where the plate potential is referenced to the CMOS ground potential using diodes Dplate. In this application, the plate-electrode is typically on RFGND. A combination of Rplate and Dplate can also be used.

These electrical connections between the moveable plate and CMOS ground are required for the electrostatic actuation. However, these connections also can create issues during processing of the 2-layer plate. Specifically, having the moveable plate connected to CMOS ground during processing can cause stresses in the moveable plate which can shift the actuation voltages Vpu and Vpd out of spec, significantly impacting the wafer yield.

Therefore, there is a need in the art to provide a means to avoid this issue and obtain more controlled actuation voltages.

SUMMARY OF THE INVENTION

The present invention generally relates to a MEMS DVC and a method for manufacture thereof. The top and bottom plate of the movable plate within a MEMS DVC should have the same stress level to ensure proper operation of the MEMS DVC. To obtain the same stress level, the movable plate is decoupled from CMOS ground during fabrication. The movable plate is only electrically coupled to CMOS ground after the plate has been completely formed. The coupling occurs by using the same layer that forms the pull-up electrode as the layer that electrically couples the movable plate to CMOS ground. As the same layer couples the movable plate to CMOS ground and also provides the pull-up electrode for the MEMS DVC, the deposition occurs in the same processing step. By electrically coupling the movable plate to CMOS ground after formation, the stress in each of the layers of the movable plate can be substantially identical.

In one embodiment, a MEMS DVC comprises a movable plate disposed in a cavity formed above a substrate, the movable plate is disposed between a pull-in electrode and a pull-off electrode and coupled to a movable plate electrode, and the pull-off electrode is formed of an electrically conductive layer; a plate grounding electrode coupled to the movable plate electrode; and a CMOS ground electrode coupled to the plate grounding electrode by the electrically conductive layer.

In another embodiment, a method of forming a MEMS DVC comprises depositing a first electrically conductive layer over a substrate; patterning the first electrically conductive layer to form a CMOS ground electrode, a plate grounding electrode, a movable plate electrode, a pull-in electrode and an RF electrode; depositing a dielectric layer over the substrate and the CMOS ground electrode, the plate grounding electrode, the movable plate electrode, the pull-in electrode and the RF electrode; forming openings through the dielectric layer to expose at least a portion of the CMOS ground electrode, the plate grounding electrode and the movable plate electrode; forming anchor elements over the dielectric layer and in contact with the CMOS ground electrode, the plate grounding electrode and the movable plate electrode; forming a movable plate over and in contact with the anchor element that is in contact with the movable plate electrode; and depositing a second electrically conductive layer over the movable plate and the anchor elements formed over and in contact with the CMOS grounding electrode and the plate grounding electrode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 7A-7C are schematic cross-section illustrations of the generation of the two-layer semi-rigid plate of a MEMS DVC according to one embodiment.

FIGS. 9A-9G are schematic cross-section illustrations of a MEMS DVC device at various stages of fabrication.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a MEMS DVC and a method for manufacture thereof. The top and bottom plate of the movable plate within a MEMS DVC should have the same stress level to ensure proper operation of the MEMS DVC. To obtain the same stress level, the movable plate is decoupled from CMOS ground during fabrication. The movable plate is only electrically coupled to CMOS ground after the plate has been completely formed. The coupling occurs by using the same layer that forms the pull-up electrode as the layer that electrically couples the movable plate to CMOS ground. As the same layer couples the movable plate to CMOS ground and also provides the pull-up electrode for the MEMS DVC, the deposition occurs in the same processing step. By electrically coupling the movable plate to CMOS ground after formation, the stress in each of the layers of the movable plate can be substantially identical.

Figure 1:
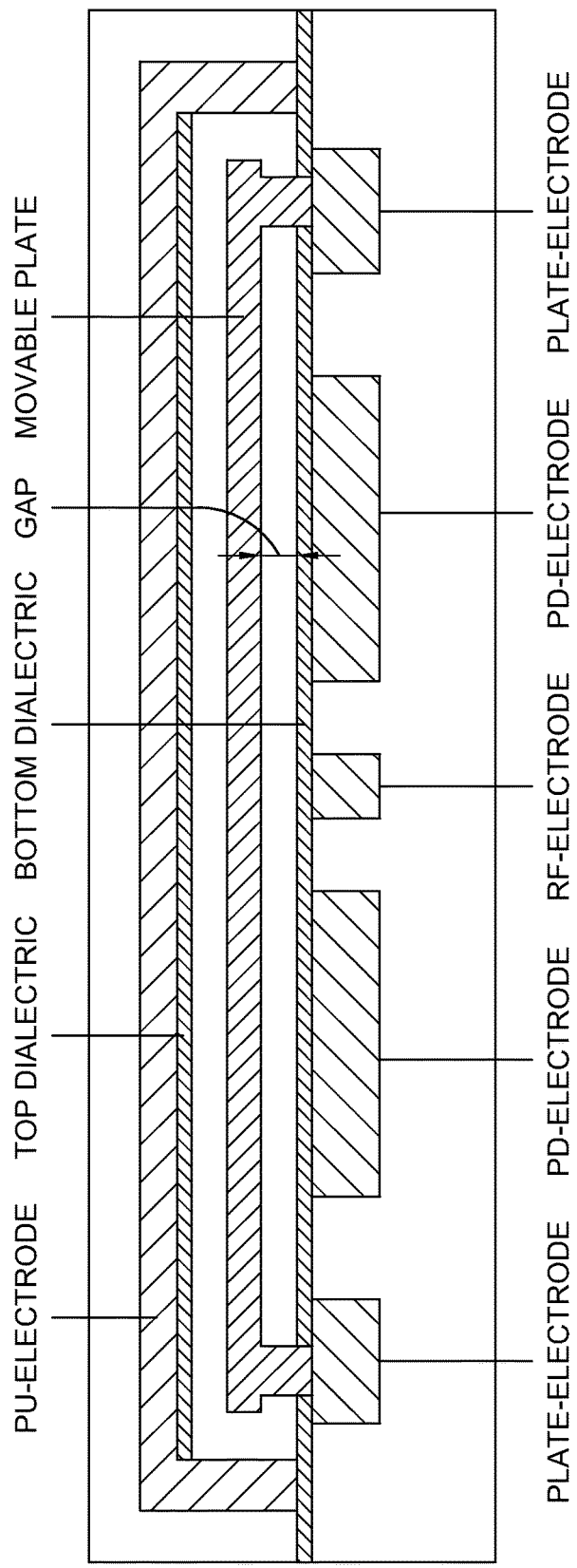
FIG. 1 is a schematic cross-section illustration of a MEMS DVC in the free-standing state.
Figure 2:
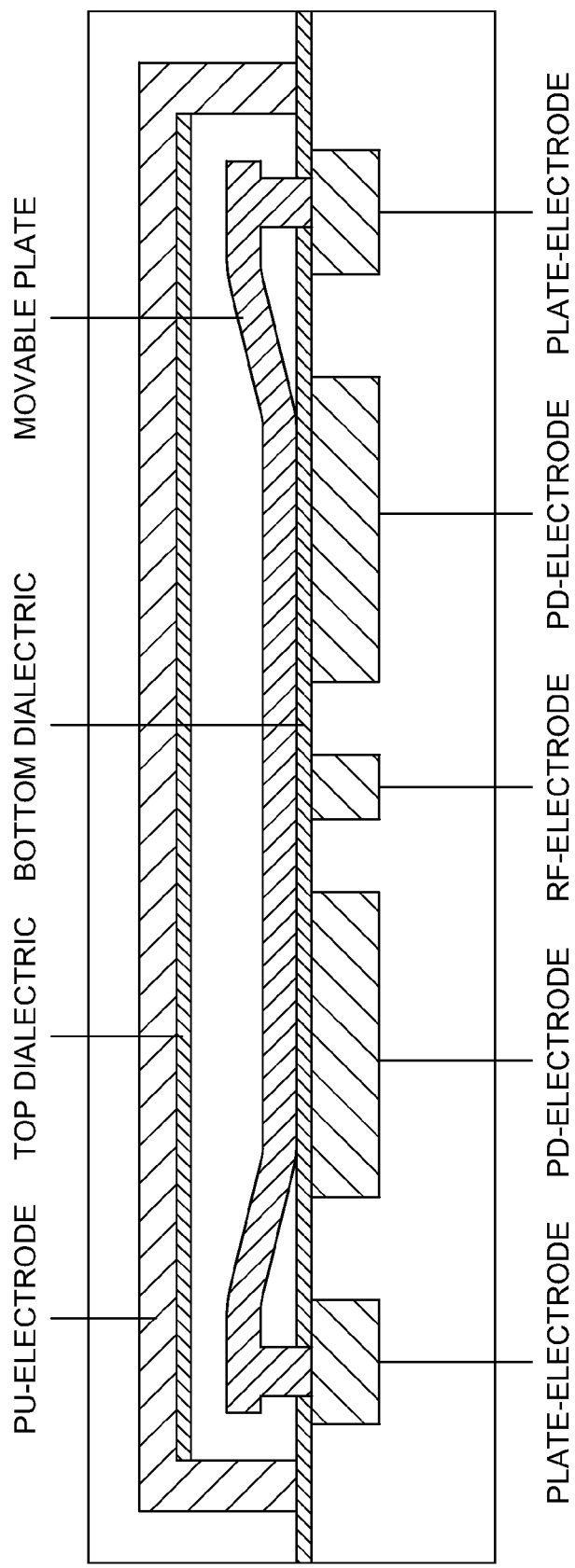
FIG. 2 is a schematic cross-section illustration of the MEMS DVC of FIG. 1 in the $C_{max}$ state.
Figure 3:
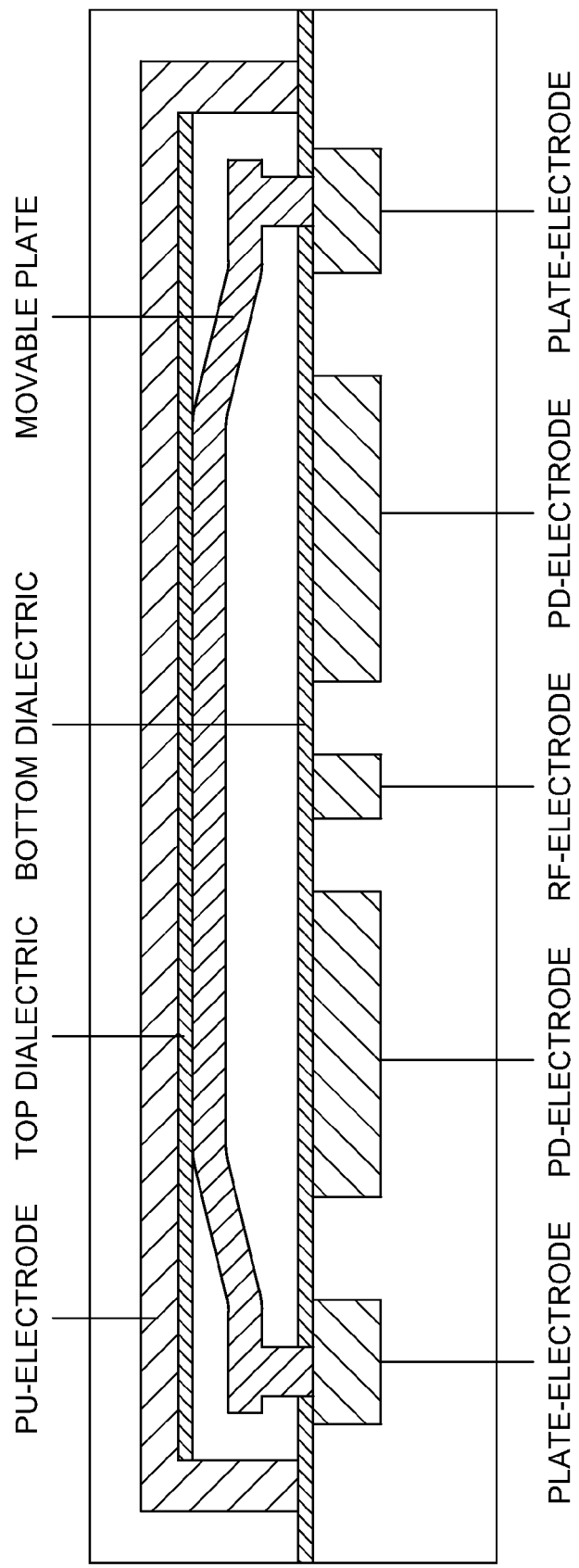
FIG. 3 is a schematic cross-section illustration of the MEMS DVC of FIG. 1 in the $C_{min}$ state.
Figure 4:
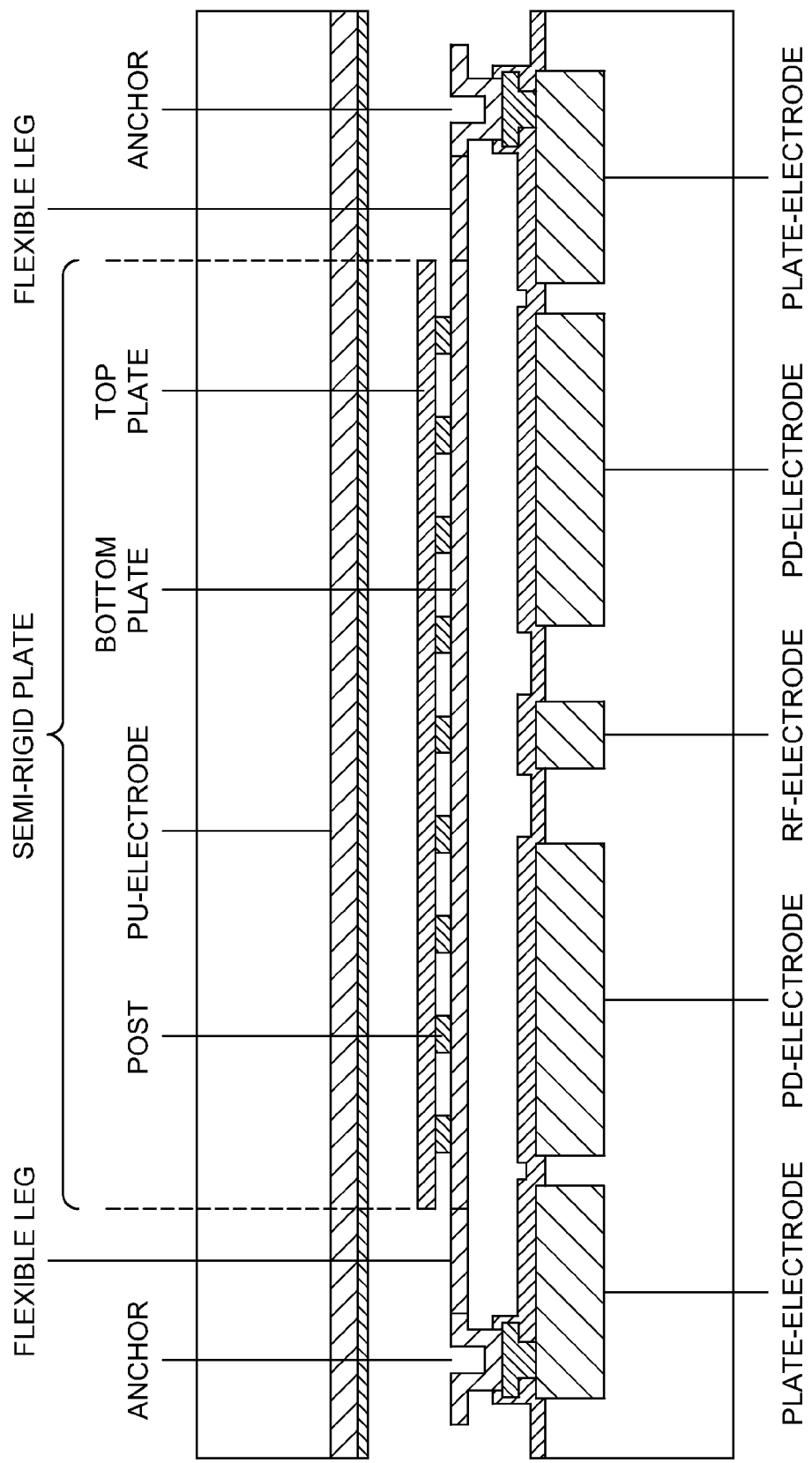
FIG. 4 is a detailed cross-section illustration of a MEMS DVC according to another embodiment.

The electrostatic actuation forces that move the plate into the $C_{min}$ or $C_{max}$ position scale with $(Voltage/gap)^2$. For a tight control of the actuation voltages Vpu and Vpd it is required that the moveable plate after processing is flat and does not exhibit any curvature (i.e., the gap between the moveable plate and the PD and PU-electrodes needs to tightly controlled). In a 2-layer rigid plate construction as in FIG. 4, this means the absolute stress of the bottom-plate and the top-plate need to be matched.

If the stress in the top-plate is more compressive than in the bottom-plate then the plate tends to deform in a frown-shape. As a result, the device will exhibit a greater gap towards the PD-electrode and the resulting actuation voltage Vpd towards the bottom will be increased. At the same time, the device will exhibit a smaller gap towards the PU-electrode and the actuation voltage Vpu towards the top will be reduced. Similarly, if the stress in the top-plate is more tensile than in the bottom-plate then the plate tends to deform into a smiley-shape and the actuation voltage Vpd will be reduced and the actuation voltage Vpu will be increased.

FIGS. 7A-7C show the process steps used to generate the 2-layer semi-rigid plate with the flexible leg suspension. First the bottom-plate layer is deposited on top of the first sacrificial layer SL1 and patterned to generate the bottom plate and the flexible-leg (See FIG. 7A). Then the bottom plate is covered with a second sacrificial layer SL2 which is subsequently patterned to generate several holes in SL2 on top of the bottom plate (See FIG. 7B). Lastly, the top plate layer is deposited on top of the second sacrificial layer SL2 and into the holes to contact the bottom-plate (See FIG. 7C). At the end of the process the sacrificial layers SL1 and SL2 are removed leaving the moveable plate suspended above the surface.

If the plate-electrode is connected to the CMOS ground (i.e., the substrate) during these process steps, thermal effects and plasma-effects can change the stress in the bottom and top-plate during the deposition and etching of the layers. This change in stress subsequently results in a non-flat beam structure which results in a shifted Vpd and Vpu and a reduced wafer yield.

By electrically disconnecting the plate-electrode from the CMOS ground (i.e., substrate) during the fabrication steps of the dual-layer plate the stress in the bottom-plate and top-plate can be better controlled, resulting in tightly controlled actuation voltages Vpu and Vpd. To still provide the electrical connection of the plate-electrode to CMOS ground during operation (required for electrostatic actuation), the electrical connection is made using the top-electrode layer, similar to what is done in CMOS designs to avoid antenna violations. In this way the electrical connection is made after the dual-layer beam has been generated and the stress in both layers can be matched.

Figure 5:
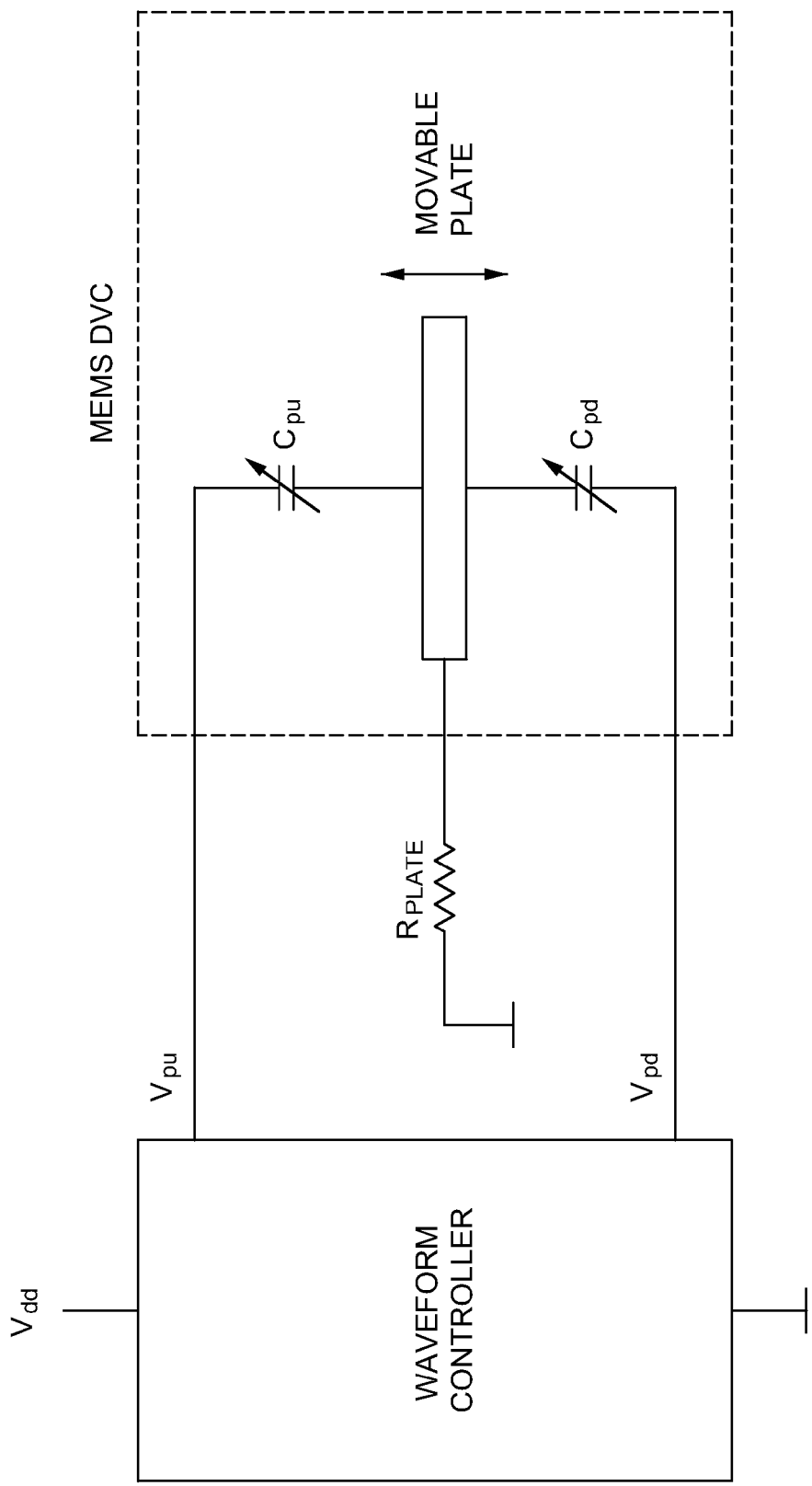
FIG. 5 is a schematic illustration of a waveform controller connected to a MEMS DVC device where the plate potential is referenced to CMOS ground via resistor Rplate.
Figure 6:
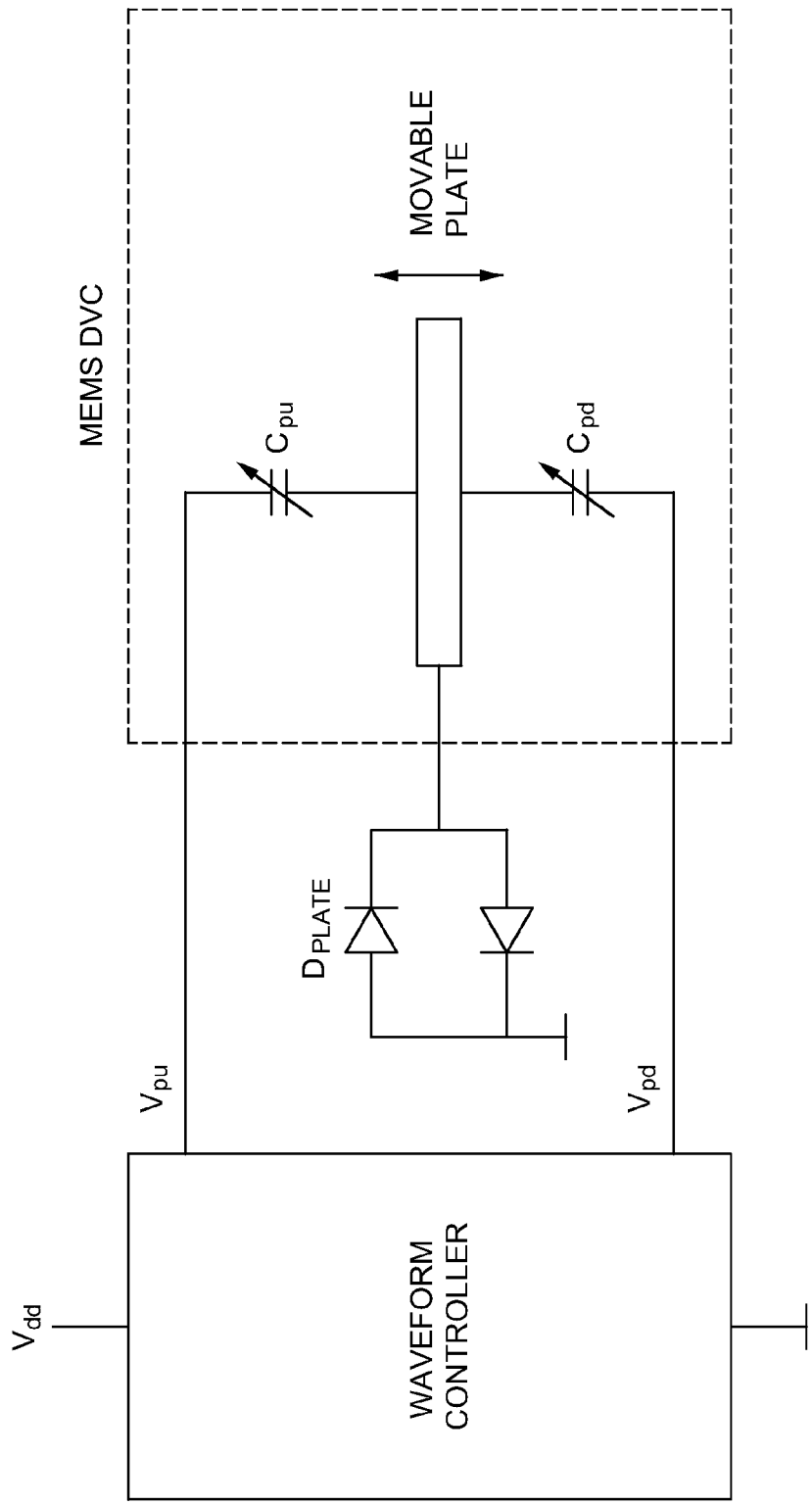
FIG. 6 is a schematic illustration of a waveform controller connected to the MEMS DVC device where the plate potential is referenced to CMOS ground via diodes Dplate.
Figure 8:
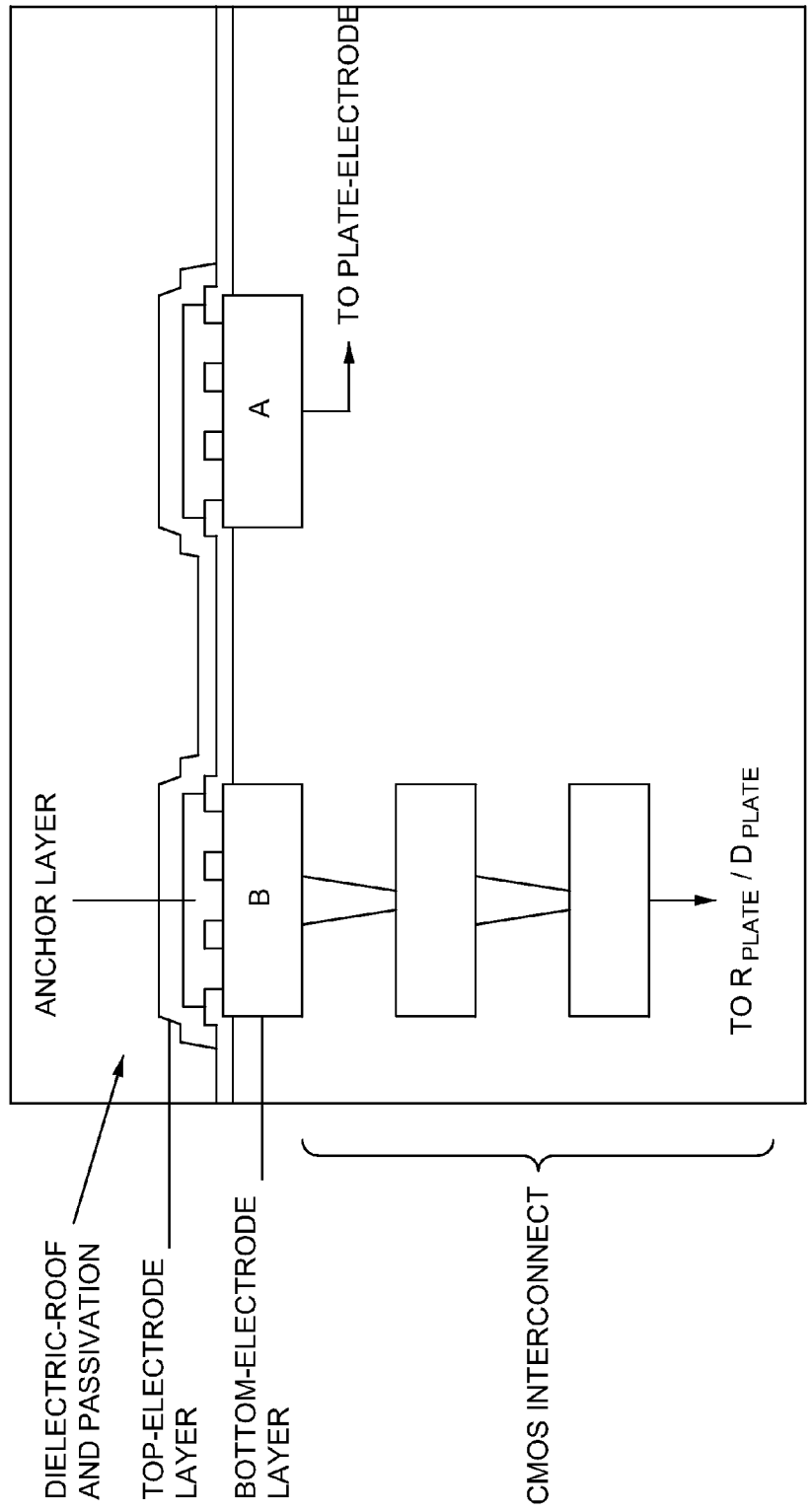
FIG. 8 is a schematic illustration of the structure used to disconnect the plate-electrode from the CMOS ground during formation of the movable plate according to one embodiment.

FIG. 8 shows a cross-section view of the structure used to disconnect the plate-electrode from the CMOS ground during the fabrication of the dual-layer plate. Structures A and B are both generated in the bottom-electrode layer (i.e. the layer used for the plate-electrode, PD-electrode and RF-electrode). Structure A is connected to the plate-electrode of the MEMS DVC device and structure B is connected to the CMOS ground via Rplate (See FIG. 5) or Dplate (See FIG. 6).

By using the anchor-layer and top-electrode layer which are also used in the DVC process, structure A is connected to structure B after the top-electrode layer (i.e., the layer used for the PU-electrode) has been deposited. Prior to the top-electrode deposition, structure A is electrically disconnected from structure B and the plate-electrode is left floating. This enables the stress-control of the bottom-plate and the top-plate during the fabrication process and results in well-controlled actuation voltages Vpu and Vpd.

Figure 9C:
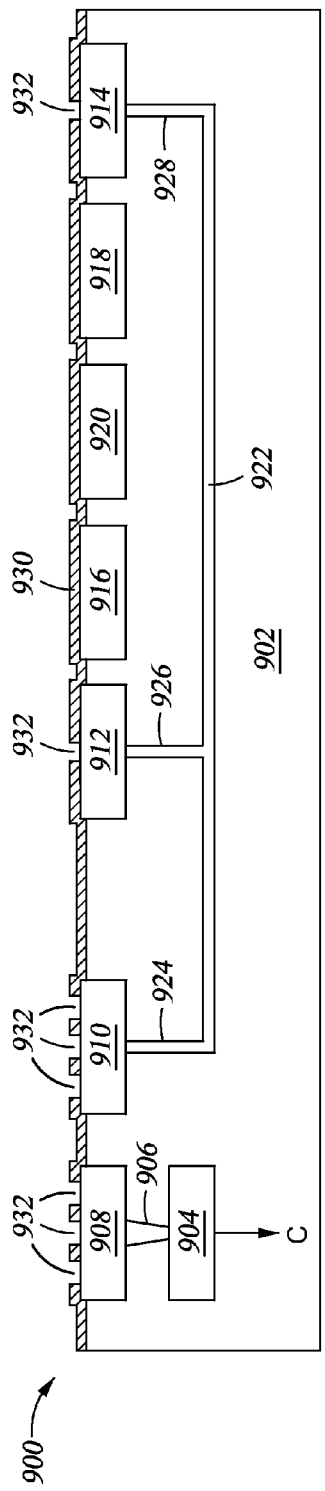

FIGS. 9A-9G are schematic cross-section illustrations of a MEMS DVC device 900 at various stages of fabrication. As shown in FIG. 9A, the MEMS DVC is formed over a substrate 902 having one or more layers therein having one or more electrodes 904 formed therein The electrodes 904 may be coupled to Rplate or Dplate at lower levels of the substrate 902 as shown by arrow "C". Several electrodes 908, 910, 912, 914, 916, 918, 920 may be formed over the substrate 902. The electrodes 908, 910, 912, 914, 916, 918, 920 are formed by depositing an electrically conductive material over the substrate 902 and either by blanket deposition followed by patterning or by depositing the electrically conductive material over the substrate 902 having a mask thereover.

A CMOS ground electrode 908 (i.e., structure "B" in FIG. 8) that is formed is coupled to one or more metal conductors 904 formed in lower levels of the 902 by way of a via 906 filled with electrically conductive material. As such, electrode 908 is grounded to the substrate 902 via resistor Rplate or diode Dplate immediately upon fabrication of the electrode 908.

A plate grounding electrode 910 (i.e., structure "A" in FIG. 8) is decoupled from the CMOS ground electrode 908 at this point in fabrication, but is connected to the movable plate electrodes 912, 914 by way of a metal conductor 922 and vias 924, 926, 928 that are formed within the substrate 902 and filled with electrically conductive material. While not shown, pull-down electrodes 916, 918 are coupled by way of vias and trenches to other layers of the substrate 902 to make an electrical connection to a power source that is separate from the substrate 902. Similarly, RF electrode 920 is coupled to an RF bond pad at a location not shown in the drawings. Each of the electrodes 908, 910, 912, 914, 916, 918, 920 are formed in the same fabrication step.

Following formation of the electrodes 908, 910, 912, 914, 916, 918, 920, a dielectric layer 930 may be formed over the electrodes 908, 910, 912, 914, 916, 918, 920 as shown in FIG. 9B. Suitable materials that may be used for the dielectric layer 930 include silicon nitride, silicon oxides, silicon oxynitrides, and other electrically insulating materials. The dielectric layer 930 will ultimately space the movable plate from the RF electrode 920 when the movable plate is in the $C_{max}$ position because the movable plate will land (i.e., contact) the dielectric layer 930 and not the RF electrode 920.

After the dielectric layer 930 has been deposited, the dielectric layer 930 is patterned to form openings 932 through the dielectric layer 930 at selected locations to expose selected electrodes. As shown in FIG. 9C, the openings 932 are formed to expose the CMOS ground electrode 908, the plate grounding electrode 910 and the movable plate electrodes 912, 914. The openings 932 may be formed by etching the dielectric layer 930 with a suitable etchant.

Figure 9D:
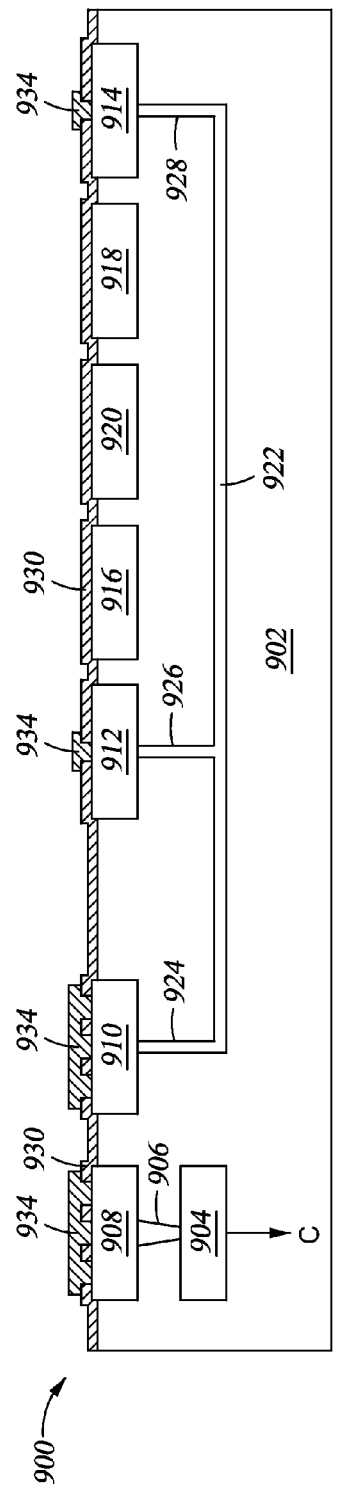

An electrically conductive material, such as titanium nitride, may then be formed within the openings 932 and over portions of the dielectric layer 930 to form anchor structures 934 as shown in FIG. 9D. The anchor structures 934 may be formed by either a blanket deposition of the electrically conductive material followed by etching or by placing a mask over the dielectric layer 930 (a different mask than used to form the openings 932) and then selectively depositing onto the exposed areas. At this point in time, the plate grounding electrode 908, and hence the movable plate electrodes 912, 914, are electrically isolated from CMOS ground because the plate grounding electrode 910 is electrically isolated from the CMOS ground electrode 908.

Figure 9E:
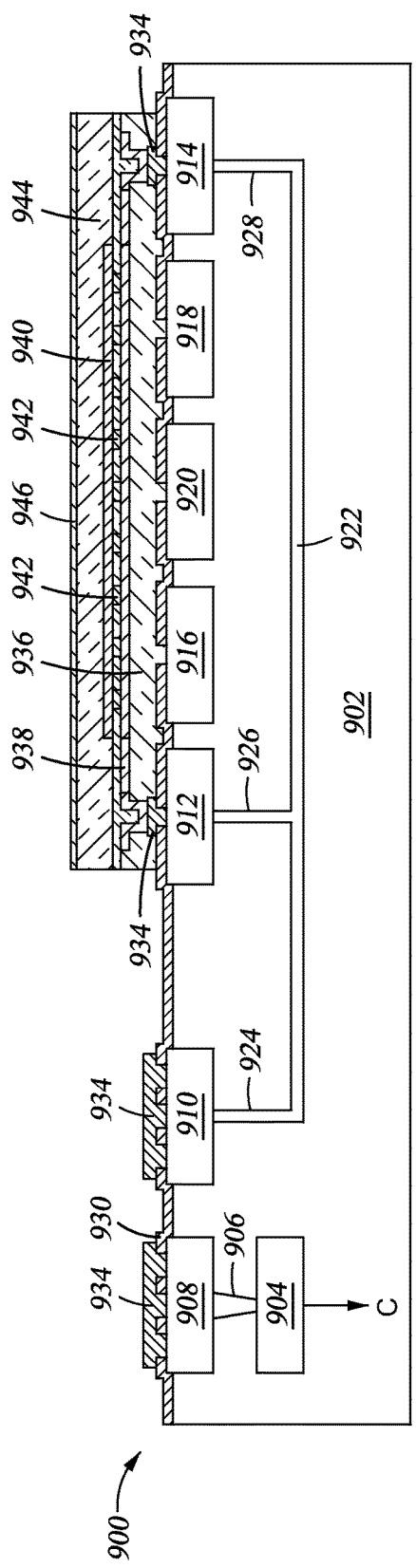

Following formation of the anchor structures 934, formation of the movable plate may continue. As shown in FIG. 9E, no further deposition or layers are formed over the CMOS ground electrode 908 or plate grounding electrode 910 while additional layers are formed over the other electrodes 912, 914, 916, 918, 920. It is to be understood that non-conductive masking layers may be formed over the CMOS ground electrode 908 and plate grounding electrode 910 during formation of the additional layers, however no permanent layers are formed over the CMOS ground electrode 908 and plate grounding electrode 910. Additionally, no electrical connection is formed between the CMOS ground electrode 908 and the plate grounding electrode 910 during formation of the additional layers. The additional layers formed include a sacrificial layer 936 to space the movable plate from the dielectric layer 930, a bottom layer 938 of the movable plate, the top layer 940 of the movable plate, posts 942 connecting the two plates 938, 940, additional sacrificial material 944 and a dielectric layer 946 as shown in FIG. 9E.

Figure 9F:
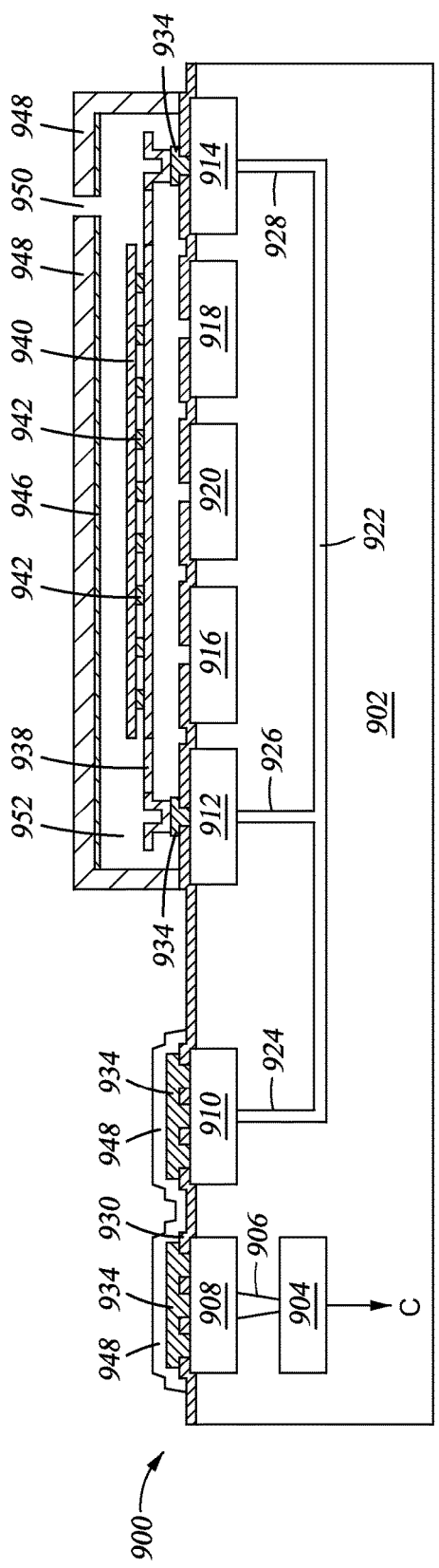

After formation of the additional layers, most notably the movable plate, an electrically conductive layer 948 is deposited that will be form not only the pull-up electrode but also provide an electrical connection between the CMOS ground electrode 908 and the plate grounding electrode 910 as shown in FIG. 9F. The electrically conductive layer 948 may be deposited by blanket deposition followed by an etching process to decouple the pull-up electrode from the electrical connection between the CMOS ground electrode 908 and the plate grounding electrode 910. Alternatively, the electrically conductive layer 948 may be deposited by first forming a mask over the device and then selectively depositing in the openings. Suitable materials that may be used for the electrically conductive layer include titanium nitride, aluminum, titanium-aluminum, copper, titanium, tungsten, gold and other electrically conductive materials.

An opening 950 is then formed through the electrically conductive layer 948 above the additional layers. The opening 950 extends through the electrically conductive layer 948 as well as the second dielectric layer 946 to expose the sacrificial material 944, 936. Thereafter, an etchant is introduced through the opening 950 and the sacrificial material 936, 944 is removed such that a cavity 952 is formed and the movable plate is free to move within the cavity between the free-standing state, $C_{max}$ and $C_{min}$.

Figure 9G:
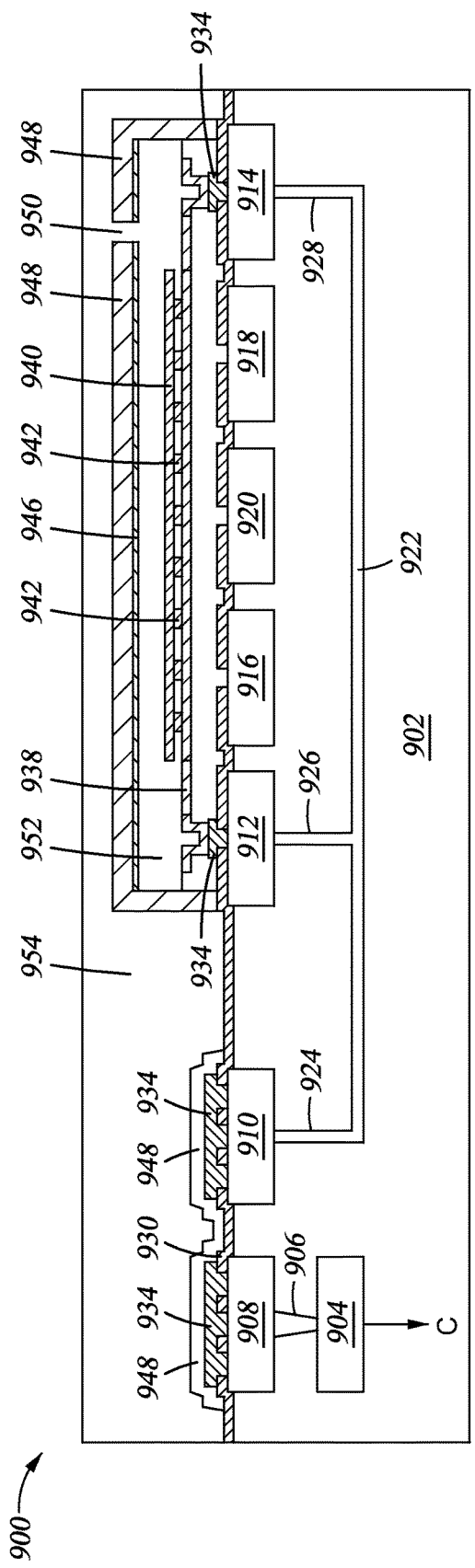

Following release of the movable plate within the cavity 952, a passivation or dielectric roof 954 may be deposited to seal the cavity 952 as shown in FIG. 9G. Suitable materials that may be used for the passivation layer 954 include silicon oxides, silicon nitride, silicon oxynitride and other insulating materials. As shown in FIGS. 9A-9G, the movable beam is electrically decoupled from the CMOS substrate 902 until formation of the pull-up electrode. Thus, each layer of the movable beam will have substantially the same stress.

Electrically disconnecting the MEMS device from the CMOS ground (i.e., the substrate) during the dual-layer plate fabrication process avoids thermal and plasma induced stress-changes in the plate-layers. By removing the electrical connection, the MEMS device is also more thermally isolated from the substrate which also helps to improve the stress control of the plate-layers. Additionally, using the top-electrode layer to make the electrical connection between the MEMS device and the CMOS ground, so that the electrical connection is made after the dual-layer beam has been generated is an effective manner to ensure the MEMS device still functions as intended. By electrically disconnecting the movable plate during plate formation, there is improved wafer yield and a wider process window for the generation of the dual-layer plate.

While the foregoing is directed to embodiments of the present invention, other and further embodiments of the invention may be devised without departing from the basic scope thereof, and the scope thereof is determined by the claims that follow.

The invention claimed is:

1. A MEMS DVC, comprising:
   a movable plate disposed in a cavity formed above a substrate, the movable plate is disposed between a pull-in electrode and a pull-off electrode and coupled to a movable plate electrode, and the pull-off electrode is formed of an electrically conductive layer;
   a plate grounding electrode coupled to the movable plate electrode; and
   a CMOS ground electrode coupled to the plate grounding electrode by the electrically conductive layer.

2. The MEMS DVC of claim 1, further comprising:
   a first anchor structure coupled to the plate grounding electrode on a surface opposite the substrate; and
   a second anchor structure coupled to the CMOS ground electrode on a surface opposite the substrate, wherein the electrically conductive layer is coupled to the first anchor structure and the second anchor structure.

3. The MEMS DVC of claim 2, wherein the movable plate electrode is coupled to the plate grounding electrode through one or more electrically conductive filled vias or trenches and metal conductors formed within the substrate.

4. The MEMS DVC of claim 3, wherein the CMOS ground electrode is coupled to one or more metal conductors disposed within the substrate.

5. The MEMS DVC of claim 4, further comprising a dielectric layer formed at least partially over the pull-in electrode, the plate grounding electrode and the CMOS ground electrode.

6. The MEMS DVC of claim 5, wherein the movable plate comprises multiple layers coupled together by one or more posts and wherein each layer of the multiple layers has substantially identical stress.

7. The MEMS DVC of claim 1, wherein the movable plate electrode is coupled to the plate grounding electrode through one or more electrically conductive filled vias or trenches and metal conductors formed within the substrate.

8. The MEMS DVC of claim 1, wherein the CMOS ground electrode is coupled to one or more metal conductors disposed within the substrate.

9. The MEMS DVC of claim 1, further comprising a dielectric layer formed at least partially over the pull-in electrode, the plate grounding electrode and the CMOS ground electrode.

10. The MEMS DVC of claim 1, wherein the movable plate comprises multiple layers coupled together by one or more posts and wherein each layer of the multiple layers has substantially identical stress.

11. A method of forming a MEMS DVC, comprising:
depositing a first electrically conductive layer over a substrate;
patterning the first electrically conductive layer to form a CMOS ground electrode, a plate grounding electrode, a movable plate electrode, a pull-in electrode and an RF electrode;
depositing a dielectric layer over the substrate and the CMOS ground electrode, the plate grounding electrode, the movable plate electrode, the pull-in electrode and the RF electrode;
forming openings through the dielectric layer to expose at least a portion of the CMOS ground electrode, the plate grounding electrode and the movable plate electrode;
forming anchor elements over the dielectric layer and in contact with the CMOS ground electrode, the plate grounding electrode and the movable plate electrode;
forming a movable plate over and in contact with the anchor element that is in contact with the movable plate electrode; and
depositing a second electrically conductive layer over the movable plate and the anchor elements formed over and in contact with the CMOS grounding electrode and the plate grounding electrode.

12. The method of claim 11, wherein after the patterning, the plate grounding electrode is electrically coupled to the movable plate electrode through electrically conductive material formed in the substrate.

13. The method of claim 12, wherein after patterning and during formation of the movable plate, the CMOS ground electrode and the plate grounding electrode are electrically isolated from one another.

14. The method of claim 13, wherein after depositing the second electrically conductive layer, the CMOS ground electrode and the plate grounding electrode are electrically coupled together.

15. The method of claim 14, wherein forming a movable plate comprises forming multiple layers coupled together by one or more posts, wherein each layer of the multiple layers has a substantially identical stress and wherein the moveable plate electrode is electrically coupled to the plate grounding electrode during formation of the movable plate.

16. The method of claim 15, further comprising forming a cavity and removing sacrificial material from the cavity to free the movable plate to move within the cavity.

17. The method of claim 11, wherein after patterning and during formation of the movable plate, the CMOS ground electrode and the plate grounding electrode are electrically isolated from one another.

18. The method of claim 11, wherein after depositing the second electrically conductive layer, the CMOS ground electrode and the plate grounding electrode are electrically coupled together.

19. The method of claim 11, wherein forming a movable plate comprises forming multiple layers coupled together by one or more posts, wherein each layer of the multiple layers has a substantially identical stress and wherein the moveable plate electrode is electrically coupled to the plate grounding electrode during formation of the movable plate.

20. The method of claim 11, further comprising forming a cavity and removing sacrificial material from the cavity to free the movable plate to move within the cavity.

* * * * *